United States Patent
Dai et al.

(10) Patent No.: US 8,805,046 B2
(45) Date of Patent: Aug. 12, 2014

(54) METHOD AND DEVICE FOR CORRECTING A SHIMMING DEVICE

(75) Inventors: Rui Bin Dai, Hamilton (CA); Qiang He, Shenzhen (CN); Xiao Cong Xing, Nanjing (CN)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/358,395

(22) Filed: Jan. 25, 2012
(Under 37 CFR 1.47)

(65) Prior Publication Data
US 2013/0308869 A1 Nov. 21, 2013

(30) Foreign Application Priority Data
Jan. 26, 2011 (CN) .......................... 2011 1 0027355

(51) Int. Cl.
*G06K 9/00* (2006.01)
(52) U.S. Cl.
USPC ......................................... 382/131; 324/312
(58) Field of Classification Search
USPC ................................................ 382/131–132
See application file for complete search history.

(56) References Cited

U.S. PATENT DOCUMENTS

| | | | | |
|---|---|---|---|---|
| 2004/0164737 | A1* | 8/2004 | Feiweier | 324/309 |
| 2005/0156593 | A1* | 7/2005 | Assmann et al. | 324/306 |
| 2006/0253017 | A1* | 11/2006 | O'Donnell et al. | 600/410 |
| 2008/0258729 | A1 | 10/2008 | Kruip | |
| 2011/0044524 | A1* | 2/2011 | Wang et al. | 382/131 |
| 2011/0176714 | A1* | 7/2011 | Salomir et al. | 382/131 |
| 2012/0133362 | A1* | 5/2012 | Gross | 324/309 |

FOREIGN PATENT DOCUMENTS

| | | |
|---|---|---|
| CN | 101290344 A | 10/2008 |
| CN | 101452065 A | 6/2009 |
| CN | 101533701 A | 9/2009 |

* cited by examiner

*Primary Examiner* — Jingge Wu
(74) *Attorney, Agent, or Firm* — Lempia Summerfield Katz LLC

(57) ABSTRACT

Disclosed in the present embodiments are a method and a device for correcting a shimming device. A phase image in a coronal plane direction of a phantom is used to make an estimation of a degree of symmetry of the phase image for each test position of the shimming device. From the image symmetry estimation result corresponding to each test position, a test position with the best image symmetry estimation result is selected to be an optimum deployment point of the shimming device.

19 Claims, 12 Drawing Sheets

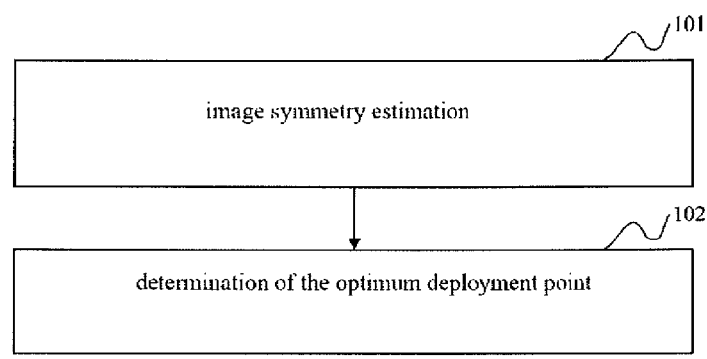
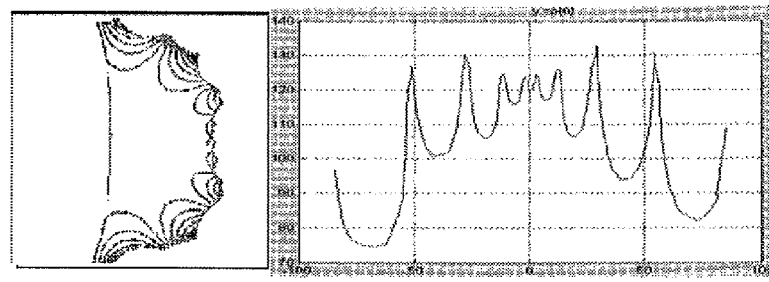

METHOD AND DEVICE FOR CORRECTING A SHIMMING DEVICE

This application claims the benefit of CN 201110027355.6, filed on Jan. 26, 2011.

TECHNICAL FIELD

The present embodiments relate to homogenization technology for magnetic fields.

BACKGROUND

Magnetic fields are widely applied in measurement and imaging technologies. For example, various types of magnetic resonance imaging (MRI) apparatus acquire molecular structures and structural information about the interior of human bodies, for example, by using nuclear magnetic resonance phenomena on the basis of the magnetic fields generated by magnets. In order to obtain MR images of high quality, a magnet in the MRI apparatus is to provide a magnetic field with very high homogeneity in a certain specific space (e.g., within a detection area). Although this may be easily achieved at the center position of the magnet, it is very difficult to provide the homogeneity of the magnetic field at eccentric positions of the magnet. For example, since a shoulder coil for scanning the shoulder of a human body may be deployed at a position close to an edge of a bore of the magnet, and the main magnetic field here may be inhomogeneous, the image quality of some specific images (e.g., images by fat suppression technology and images by water excitation technology) in these parts is significantly lowered.

A shimming device (e.g., a shim shell) may be placed in the magnet of the MRI apparatus, so as to compensate for the lack of homogeneity in the main magnetic field (e.g., B0 field). For example, a method for compensating an inhomogeneous magnetic field is proposed in Chinese patent application no. 200810239127.3. As another example, a local coil for magnetic resonance equipment is proposed in Chinese patent application no. 200710195529.3, with a second coil in the local coil carrying out a shimming process on the area where the local coil is located. The local coil is provided with relatively poor shimming effects in some areas (e.g., in an area that is non-homocentric with the main magnetic field). As another example, an improved shim for an imaging magnet is proposed in Chinese patent application no. 200810093332.3. The shimming device may be formed by some passive shimming pieces or shimming coils. Since the change of the main magnetic field at eccentric positions (e.g., edge positions) of the magnet is relatively fast, this makes the shimming effects of the shimming device quite sensitive to the deployment accuracy of the shimming device. In other words, better shimming effects may be provided only if the shimming device is deployed accurately at a position passing through the center of the cross section of the magnet.

In order to achieve the deployment of the shimming device, a laser mark is provided on the shimming device, and the shimming device with the laser mark is installed onto a test bed (e.g., a patient table (PTAB)). The laser mark on the shimming device is positioned using a laser emitted from the MRI apparatus, and the test bed with the shimming device is moved to a predetermined position according to the positioning point so as to locate the shimming device on the test bed at a center of the cross section of the magnet. By way of theoretical calculation, at this moment, the shimming device should be exactly located at the center position of the cross section of the magnet. However, in practical applications, due to engineering implementation and processing factors or changes in the environmental conditions during the transportation, installation and use of the MRI apparatus, it is very difficult to achieve the expected homogenous magnetic field distribution by way of simply positioning the shimming device using a laser. For this reason, the deployment point of the shimming device is to be adjusted, so as to find the optimum deployment point of the shimming device and to achieve better shimming effects.

SUMMARY AND DESCRIPTION

The present embodiments may obviate one or more of the drawbacks or limitations in the related art. For example, a method and a system for correcting a shimming device so as to obtain an optimum deployment point of the shimming device and to achieve better shimming effects are provided.

In one embodiment, a method for correcting a shimming device includes, for each test position of the shimming device, acquiring a phase image in a coronal plane direction of a phantom at the test position. The method also includes extracting an internal contour line in the phase image, mapping the internal contour line onto a rectangular coordinate system or a polar coordinate system to obtain a corresponding characteristic curve, and making an estimation of the degree of symmetry of the characteristic curve to obtain an image symmetry estimation result at the test position. The method includes selecting the test position with the best image symmetry estimation result as an optimum deployment point of the shimming device according to the obtained image symmetry estimation result at each test position.

In another embodiment, a device for correcting a shimming device includes a test position symmetry estimation unit that is for acquiring, for each of the test positions of the shimming device, a phase image in the coronal plane direction of a phantom at the test position and extracting an internal contour line in the phase image. The test position symmetry estimation unit is also for mapping the internal contour line onto a rectangular coordinate system or a polar coordinate system to obtain a corresponding characteristic curve and making an estimation of the a degree of symmetry of the characteristic curve to obtain an image symmetry estimation result at the test position. The device also includes an optimum deployment point determination unit that is for selecting the test position with the best image symmetry estimation result as an optimum deployment point of the shimming device according to the image symmetry estimation result at each test position obtained by the test position symmetry estimation unit.

Since the phase image in the coronal plane direction of the phantom is used in making an estimation of the degree of symmetry of the image for each of the test positions of the shimming device, the test position with the best image symmetry estimation result may be selected from the image symmetry estimation results corresponding to the various test positions as the optimum deployment point of the shimming device according to the relationship between image symmetry and magnetic field distribution. Better shimming effects are achieved by deploying the shimming device at the optimum deployment point.

BRIEF DESCRIPTION OF THE DRAWINGS

FIG. 1 is a flow chart of one embodiment of a method for correcting a shimming device;

FIG. 2a is an example phase image acquired in the coronal plane direction of a phantom;

FIG. 2b is an example amplitude image acquired in the coronal plane direction of the phantom;

FIG. 2c is an example image mask obtained on the basis of the amplitude image shown in FIG. 2b;

FIG. 2d is an example phase image obtained after having filtered out the noise of the phase image shown in FIG. 2a by using the image mask shown in FIG. 2c;

FIG. 2e shows all the edge lines extracted from the phase image shown in FIG. 2d;

FIG. 2f is an example characteristic curve obtained by mapping the internal contour line shown in FIG. 2e onto a polar coordinate system;

FIG. 5a is an example interpolated characteristic curve obtained by carrying out interpolation processing on the characteristic curve shown in FIG. 2f;

FIG. 5b is an example flipped characteristic curve obtained by performing a left-right flip of the characteristic curve shown in FIG. 5a;

DETAILED DESCRIPTION OF THE DRAWINGS

Figure 3:
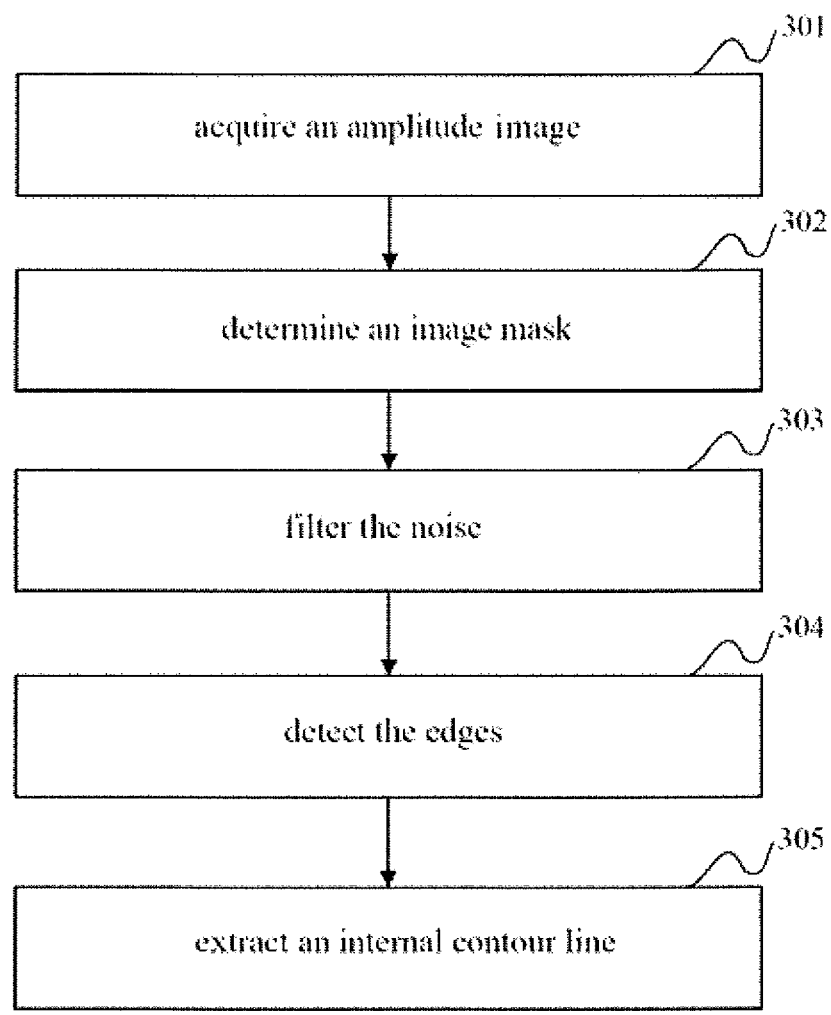
FIG. 3 is a flow chart of one embodiment of a method for extracting the internal contour line of the phase image in act 101 in FIG. 1.

In the present embodiments, in consideration of the fact that when a shimming device is deployed accurately, a main magnetic field is distributed symmetrically. According to the spherical harmonic theory, there is a correlation between magnetic field distribution and phase images (e.g., when the magnetic field is distributed symmetrically the phase image is also of a symmetrical nature). The symmetry of the main magnetic field may be obtained by detecting the symmetry of the phase image. An optimum deployment point of the shimming device that enables the main magnetic field to have the optimum symmetry may be determined according to the symmetry conditions of the phase images at various test positions of the shimming device. During practical implementation, phase images in a coronal plane direction of a phantom may be used for detecting. During practical implementation, the phantom may, for example, be a water phantom or an oil phantom.

During practical implementation, the shimming device position obtained by laser positioning may be taken as an initial position of the shimming device. After having made an estimation of image symmetry and having acquired the optimum deployment point of the shimming device, a position compensation value for the initial value of the shimming device obtained by laser positioning may be obtained according to the optimum deployment point of the shimming device. The position compensation value stored in the system, and when in use, the shimming device, is adjusted from the initial position to the optimum deployment point according to the position compensation value.

The present embodiments are further described in detail below by way of example.

FIG. 1 is an exemplary flow chart of a method for correcting a shimming device. As shown in FIG. 1, the flow includes the following acts.

In act 101, for each test position of the shimming device, a phase image in the coronal plane direction of a phantom is acquired at the test position, and an internal contour line in the phase image is extracted. The internal contour line is mapped onto a rectangular coordinate system or a polar coordinate system (the polar coordinate system is taken as an example hereinafter) to obtain a corresponding characteristic curve, and an estimation of a degree of symmetry of the characteristic curve is made to obtain an image symmetry estimation result at the test position.

During practical implementation, each of the test positions of the shimming device may be determined according to practical needs. An initial position of the shimming device may be obtained on the basis of laser positioning, and one or more positions within a predetermined range at each side of an initial position along a magnet aperture direction may be selected. The test positions may be predetermined statically, and the test positions may also be determined dynamically according to certain rules. For example, all position points obtained by taking the initial position as a center and taking 1 mm as a test interval within the range of ±10 mm along the magnet aperture direction may be statically determined as the test positions. As another example, on the basis of the spherical harmonic theory, the phase image corresponding to a magnetic field with a relatively symmetric distribution should have 9 consecutive wave troughs. Therefore, whether there are 9 consecutive wave troughs may be detected in the acquired characteristic curve of the phase image, so as to obtain a desired image by filtering. Accordingly, possible test positions may also be determined dynamically; a detailed description of this application is given below.

In act 102, the test position with the best image symmetry estimation result is selected as the optimum deployment point of the shimming device according to the obtained image symmetry estimation result at each test position.

The shimming device may be adjusted to the optimum deployment point. In one embodiment, a position compensation value for the initial value of the shimming device obtained by laser positioning may be obtained according to the optimum deployment point of the shimming device. The position compensation value is stored in the system. When the magnetic field is used for measuring or imaging, the shimming device is adjusted from the initial position obtained by the laser positioning to the optimum deployment point according to the position compensation value.

A specific example, in which a shimming device is deployed in a magnet of an MRI apparatus, is used below to describe act 101 in the method shown in FIG. 1.

When acquiring a phase image in the coronal plane direction of a phantom, a pulse sequence with phase imaging characteristics (e.g., a gradient echo field mapping diagram (gre_field_mapping) sequence) may be used. In one embodiment, a 1.5 T MRI system may be used, a first echo time (TE1) is set as 4.7 ms, and a second echo time (TE2) is set as 9.46 ms. In order to avoid the adverse effect of non-linearity of the gradient field, when acquiring the phase image, two-dimensional (2D) distortion correction and phase encoding in a head-to-foot (HF) direction may be used. A sampling rate of at least 50% and relatively large readout bandwidth (e.g., 500 Hz/pixel) may be used.

In one embodiment, a 7100 ml bottle-shaped phantom is used, and a bracket of a shoulder coil is used to assemble the shimming device. The phantom is deployed at the center (e.g., corresponding to the initial position of the shimming device) in the Z direction (e.g., a magnet aperture direction) by positioning the laser on a laser mark of the shimming device. A phase image in the coronal plane direction of the phantom at this position is acquired to obtain the phase image in the coronal plane direction of the phantom, as shown in FIG. 2*a*. The following processing gives corresponding examples based on the phase image.

In act 101, there may be many methods for extracting an internal contour line of the phase image. One implementation is described in detail below; as shown in FIG. 3, the one implementation includes the following acts.

In act 301, an amplitude image in the coronal plane direction of the phantom at a test position is acquired at the same time as acquiring the phase image in the coronal plane direction of the phantom at the test position. FIG. 2*b* is an example amplitude image acquired in the coronal plane direction of the phantom.

During practical implementation, the amplitude image corresponding to the phase image may be one diagram, or the amplitude image may be two diagrams. This is determined according to practical needs.

In act 302, an image mask is determined by using a grayscale histogram of the amplitude image. FIG. 2*c* is an example image mask obtained on the basis of the amplitude image shown in FIG. 2*b*.

In act 303, noise in the phase image in the coronal plane direction of the phantom at the test position is filtered by using the image mask to obtain a phase image after noise filtration. FIG. 2*d* is an example phase image obtained after filtering the noise of the phase image shown in FIG. 2*a* by using the image mask shown in FIG. 2*c*.

In acts 302 and 303, the image processing technology in the prior art may be used to carry out particular processing that will not be described here redundantly.

In act 304, edges of the phase image after noise filtration are detected to obtain all edge lines of the phase image. FIG. 2*e* shows all the edge lines extracted from the example phase image shown in FIG. 2*d*.

In this act, a currently available image processing technology may be used to detect the edges of the phase image (e.g., differential operation is used to detect the edges of the phase image to obtain all edge lines of the phase image).

In act 305, an internal contour line is extracted from all the edges lines. An example internal contour line from all the edge lines is as shown in FIG. 2*e*.

In this act, when extracting the internal contour line from all the edge lines, some scanning lines may be set to scan all the edge lines from an inner side to an outer side. During scanning, a first strip line where the scanning lines meet is the internal contour line.

The above process of extracting the internal contour line in the phase image is one way for processing in the present embodiments. Detection areas of the phase image may be reduced by carrying out denoising processing on the phase image. During practical application, the edges of the phase image may also be directly detected to obtain all the edge lines of the phase image. The internal contour line is extracted from all the edges lines. There is no need to carry out the denoising processing on the phase image.

In act 101, the process of mapping the internal contour line onto the polar coordinate system to obtain a corresponding characteristic curve may be as follows: a reference point is set at a position that is inclined to the inner side at the center of the internal contour line, and the internal contour line is mapped onto the polar coordinate system according to a distance between the reference point and the internal contour line and an angle between the internal contour line and a horizontal axis to obtain a corresponding characteristic curve. As shown in FIG. 2*f*, the characteristic curve is a characteristic curve obtained by mapping the internal contour line shown in FIG. 2*e* onto a polar coordinate system. The characteristic curve may also be filtered and smoothed.

In act 101, there may be many methods for making an estimation of the degree of symmetry of the characteristic curve. Two methods for making the estimation of the degree of symmetry are described below.

Figure 4:
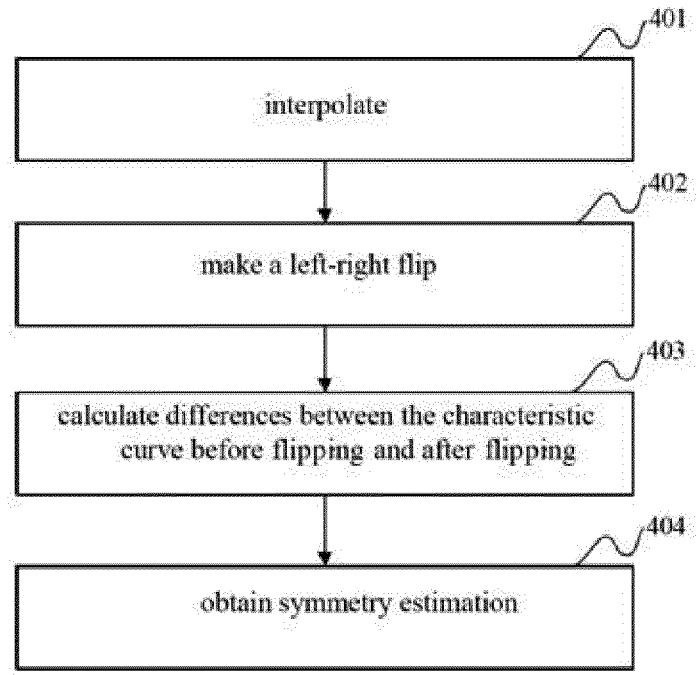
FIG. 4 is a schematic diagram of the flow of one embodiment of a method for making an estimation of left-right similarity in act 101 in FIG. 1.

FIG. 4 shows a schematic diagram of the flow of one embodiment of a method for making an estimation of left-right similarity. As shown in FIG. 4, the method for making the estimation of left-right similarity includes the following acts.

Figures 5A, 5B:
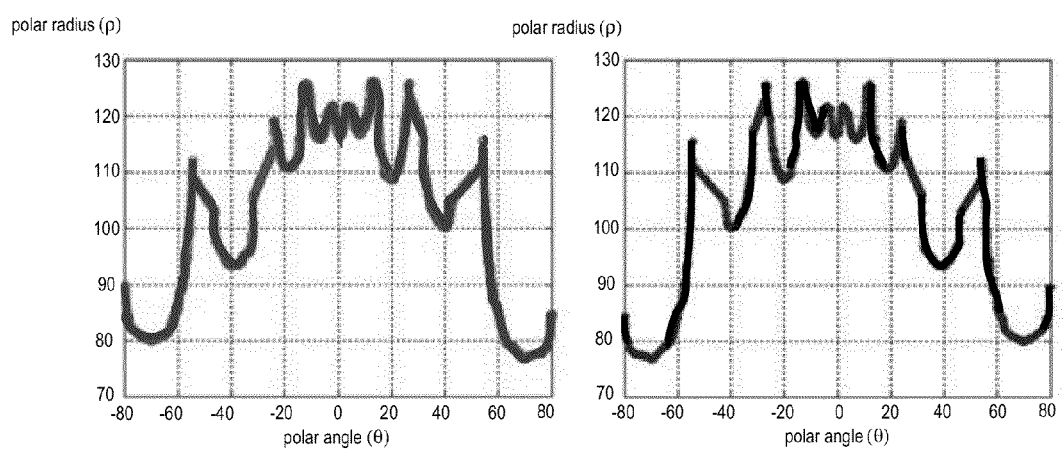

In act 401, an interpolation operation is carried out on the characteristic curve to obtain an interpolated characteristic curve. An example of the interpolated characteristic curve is shown in FIG. 5. FIG. 5*a* is an interpolated characteristic curve obtained by carrying out interpolation processing on the characteristic curve shown in FIG. 2*f*.

In this act, the particular interpolation operation method may be selected according to practical needs. For example, the interpolation operation may be carried out on the characteristic curve shown in FIG. 2*f* by taking 0.1 as the interval. The interpolation curve may be trimmed between −80° and 80° to obtain an interpolated curve shown in FIG. 5*a*.

In act 402, the interpolated characteristic curve is left-right flipped to obtain a flipped characteristic curve. FIG. 5*b* is a flipped characteristic curve obtained by performing a left-right flip of the characteristic curve shown in FIG. 5*a*.

Figure 5C:
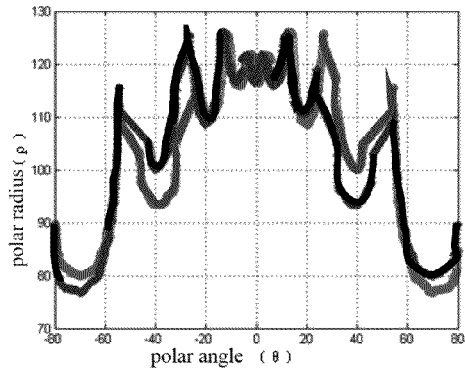
FIG. 5c is a schematic diagram of example calculated position differences between corresponding points on the characteristic curve before flipping shown in FIG. 5a and the characteristic curve after flipping shown in FIG. 5b.

In act 403, position differences between a plurality of set corresponding points on the characteristic curve before flipping and after flipping are calculated to obtain a difference value for each corresponding point position. FIG. 5*c* is a schematic diagram of calculation of the differences in position between the corresponding points on the characteristic curve before flipping shown in FIG. 5*a* and the characteristic curve after flipping shown in FIG. 5*b*.

In act 404, an estimation of the degree of symmetry of the characteristic curve is obtained according to the difference value for each corresponding point position.

In this act, there may be many methods for obtaining the estimation of the degree of symmetry of the characteristic curve according to the difference value for each corresponding point position; for example, a mean square deviation of each difference value may be calculated, and the mean square deviation is taken as the symmetry estimation result of the characteristic curve. A sum of the absolute values of each of the difference values may also be calculated, and the sum of the absolute values of the difference values is taken as a symmetry estimation result of the characteristic curve.

The process of left-right similarity estimation is, as shown in FIG. 4, in consideration of the fact that the characteristic curve obtained by mapping the internal contour line onto the polar coordinate system may be formed by several discrete points, and the interval between one point and another point may not be identical among these discrete points. For the convenience of making an estimation of left-right similarity, an interpolation operation is carried out on the characteristic curve in the above process (e.g., the above act 401 is performed to acquire an identical point interval). The above process is only one implementation for making an estimation of left-right similarity in the present embodiments. In practical applications, it is also possible not to perform act 401. In act 402, the characteristic curve that is not interpolated (e.g., the characteristic curve, as shown in FIG. 2f) is directly left-right flipped to obtain a flipped characteristic curve. In act 403, the positions of the plurality of set corresponding points may be the positions of corresponding points that are in the characteristic curve before flipping and after flipping.

It is known from mathematical theory that the more symmetric a characteristic curve is in the left-right sense, the smaller is the position difference value between corresponding points on the characteristic curve before flipping and after flipping. Accordingly, the smaller position difference value is the obtained symmetry estimation result. When the left-right similarity estimation method is used, in act 102 shown in FIG. 1, the phase image corresponding to the result that has the smallest value is selected from the symmetry estimation results (e.g., the mean square deviation of the difference value of each corresponding point and the sum of the absolute values of difference values of the corresponding points). The phase image with the best degree of symmetry, and the test position of the shimming device corresponding to the phase image with the best degree of symmetry is the optimum deployment position of the shimming device.

Figure 6:
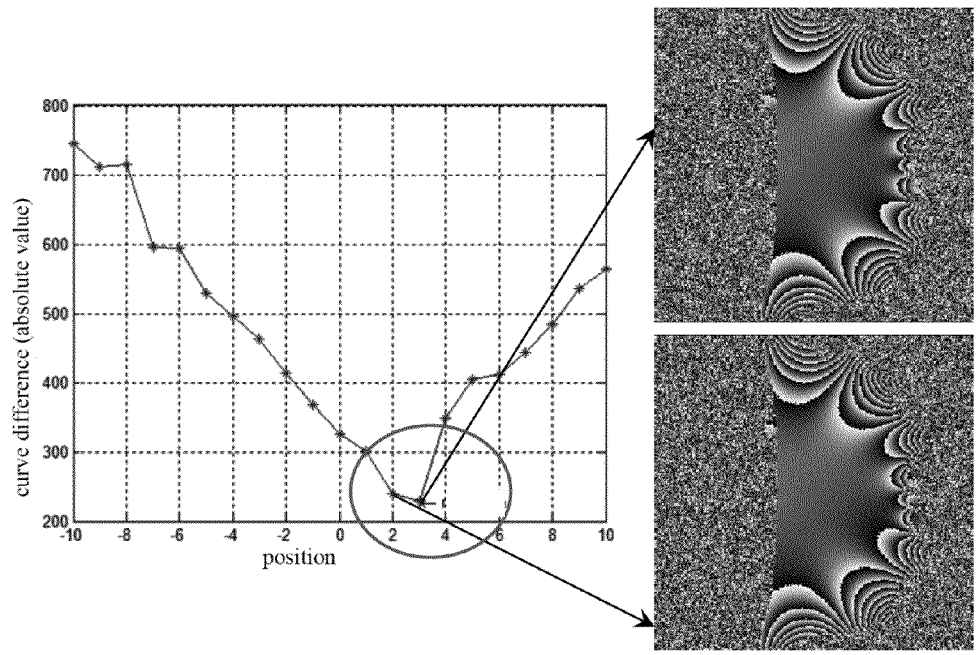
FIG. 6 is a schematic diagram of example estimation results of left-right similarity at 21 test positions of the shimming device.

FIG. 6 shows the estimation results of left-right similarity at 21 test positions of the shimming device within a ±10 mm range of the center point. The center point is the initial position obtained by laser positioning. The phase images of the coronal plane of the phantom at the test positions corresponding respectively to a minimum value and a second minimum value of the similarity estimation results are shown in the FIG. 6. In FIG. 6, the phase image of the coronal plane of the phantom at the test position corresponding to the minimum value of the similarity estimation results has the best degree of symmetry; therefore, the test position of the shimming device corresponding thereto is the optimum deployment point of the shimming device.

According to integration theory, the more symmetric a characteristic curve is, the bigger the integration value of a curve within a set range at each side of the center point thereof is. Therefore, in this embodiment, the curve within a set range at each side of the center point of the characteristic curve may also be integrated to obtain an estimation of the degree of symmetry of the characteristic curve according to the integration results. The range of the curve may be set according to practical applications; for example, as to the curve shown in FIG. 2f, the set range thereof may be the curves within a range from −20° to 20° in the polar coordinate system.

When the integration estimation method is used, in act 102 shown in FIG. 1, as to the symmetry estimation results represented by the above integration results, the phase image corresponding to the result that has the biggest value is selected therefrom as the phase image with the best degree of symmetry. The test position of the shimming device corresponding to the phase image is the optimum deployment position of the shimming device.

Figure 7:
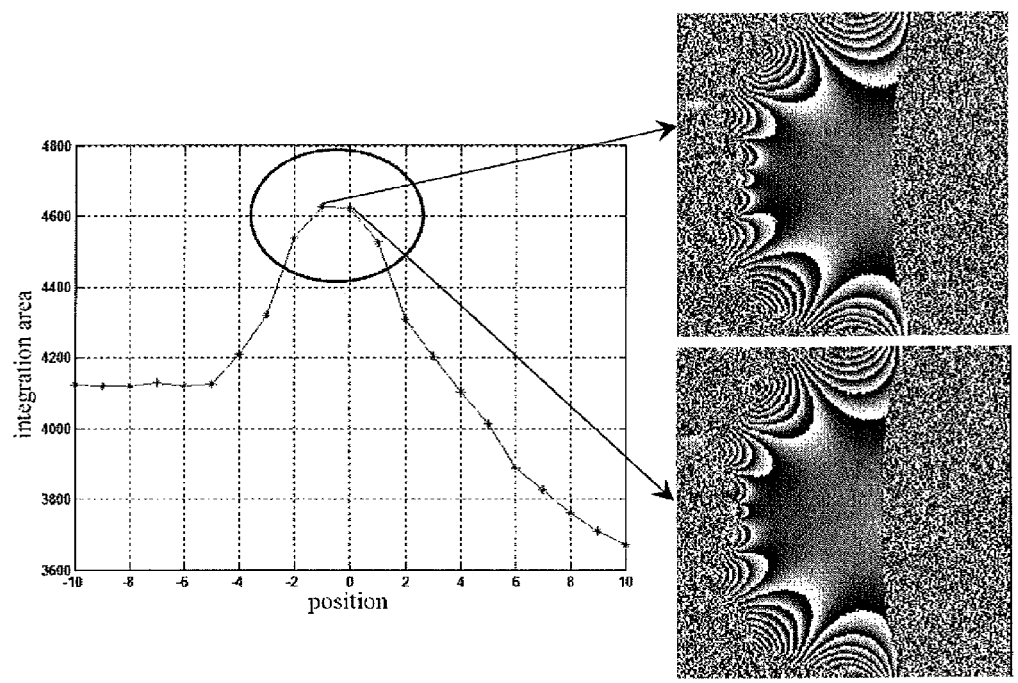
FIG. 7 is a schematic diagram of example integration estimation results at 21 test positions of the shimming device.

FIG. 7 shows the estimation results of left-right similarity at 21 test positions of the shimming device within a ±10 mm range of the center point. The center point is the initial position obtained by laser positioning. The phase images of the coronal plane of the phantom at the test positions corresponding respectively to the maximum value and the second maximum value of the similarity estimation results are shown in FIG. 7. In FIG. 7, the phase image of the coronal plane of the phantom at the test position corresponding to the maximum value of the similarity estimation results has the best degree of symmetry, and the test position of the shimming device corresponding thereto should be the optimum deployment position of the shimming device.

In act 101, a phase image in the coronal plane direction of the phantom at a test position is obtained. An internal contour line in the phase image at the test position is extracted. The internal contour line is mapped onto a polar coordinate system to obtain a corresponding characteristic curve, and an estimation of the degree of symmetry of the characteristic curve is made to obtain an image symmetry estimation result at the test position. A phase image in the coronal plane direction of the phantom at a next test position is acquired, and the above operation is repeated on the phase image at the next test position. Alternatively, the phase image in the coronal plane direction of the phantom at each test position is obtained first (e.g., the phase images in the coronal plane direction of the phantom at a plurality of test positions are obtained). An internal contour line in each phase image is extracted respectively. The extracted internal contour lines are mapped onto a polar coordinate system to obtain corresponding characteristic curves. The degree of symmetry of each characteristic curve is estimated respectively to obtain an image symmetry estimation result at each corresponding test position. Alternatively, the acquisition of the phase image, the extraction of the internal contour line, the generation of the characteristic curve, and the image symmetry estimation at each test position may also be carried out in parallel or in a cross-over way. The implementation to be used may be determined according to practical needs.

Two implementations of at 101 shown in FIG. 1 are described below in detail in conjunction with FIGS. 8 and 9, respectively.

Figure 8:
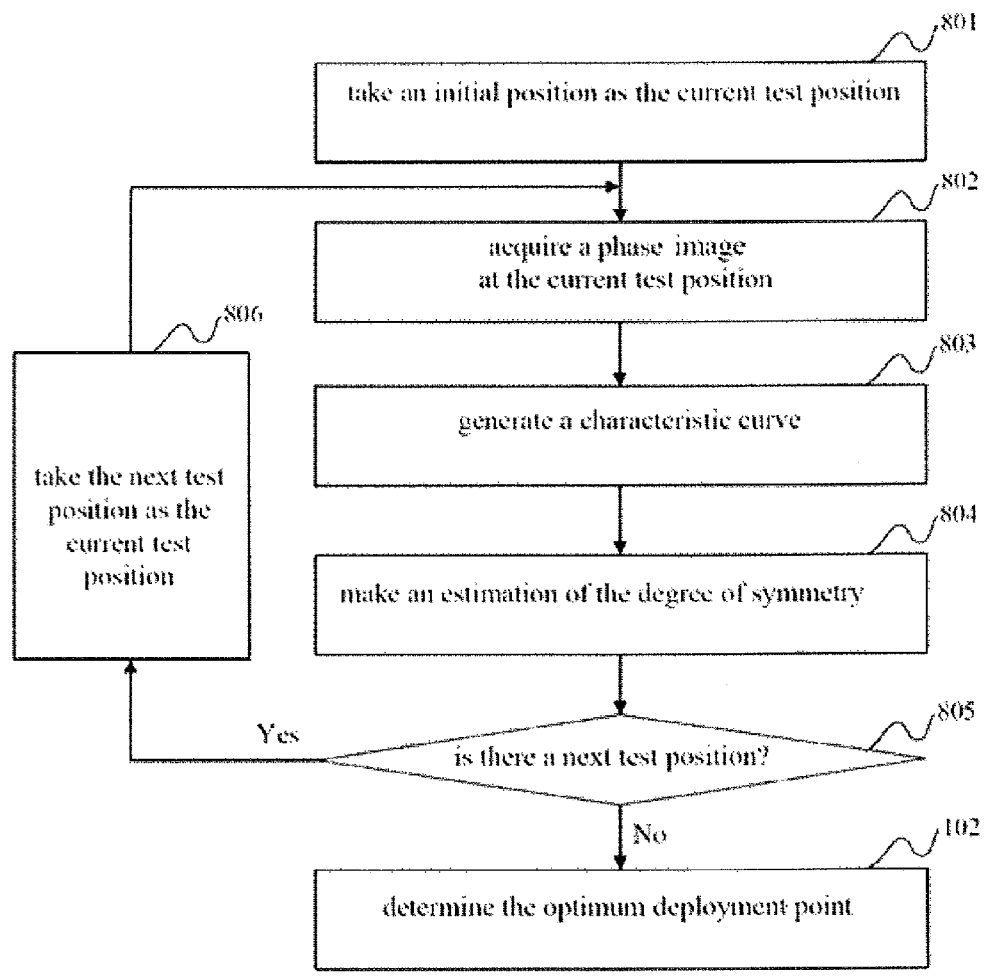
FIG. 8 is a schematic diagram of the flow of one embodiment of an implementing method of act 101 in FIG. 1.

FIG. 8 is a schematic diagram of the flow of an implementing method of act 101 in FIG. 1. As shown in FIG. 8, this flow includes the following acts.

In act 801, an initial position is determined within a predetermined test range, and the determined initial position is taken as the current test position of the shimming device.

During practical implementation, the initial position may be an initial position of the shimming device obtained on the basis of laser positioning. Accordingly, the test range may be a predetermined range at each side of the initial position. Alternatively, the initial position and the test range may also be an initial position and test range decided in advance by another method.

In act 802, a phase image in the coronal plane direction of a phantom at the current test position is obtained.

In act 803, an internal contour line in the phase image is extracted, and the internal contour line is mapped onto a polar coordinate system to obtain a corresponding characteristic curve.

In act 804, the degree of symmetry of the characteristic curve is estimated to obtain an image symmetry estimation result at the current test position.

In act 805, whether there is a next test position within the test range is determined. If there is, then act 806 is performed; the next test position is taken as the current test position, and act 802 is returned to and performed. Otherwise, act 102 is performed.

If each test position of the shimming device is already preset, for example, the setting of each test position includes an initial position of the shimming device obtained on the basis of laser positioning and each position within 10 mm at each side of the initial position at 1 mm intervals (e.g., 21 test positions in total). In act 805, one of 20 test positions other than the initial position may be selected in succession as the current test position, and the determination is that there is a subsequent test position within the predetermined range on each side of the initial position. After the symmetry estimation at all 20 test positions is completed, the determination is that there is no subsequent test position within the predetermined range on either side of the initial position.

Alternatively, between acts 803 and 805, the method may further include 804a. The number of wave troughs in the characteristic curve is detected. If the number of wave troughs in the characteristic curve is 9, then a fine search is carried out, and the test interval is set as a first test interval (e.g., 1 mm). Otherwise, a rough search is carried out, and the test interval is set as a second test interval (e.g., 2 mm). In this case, the second test interval is bigger than the first test interval. Act 804a may be performed before act 804 or act 804a may also be performed after act 804. If act 804a is performed before act 804 and if the number of wave troughs in the characteristic curve is 9, then act 804 is performed. Otherwise, act 804 may not be performed.

If a fine search is determined in act 804a, then in act 805, the next test position may be determined according to the current test position and the first test interval. For example, taking the situation where the interval is 1 mm as an example, it may be determined in act 805 that the position that is the current test position +1 mm and the position that is the current test position −1 mm are taken as next test positions respectively. If the two test positions are located within the predetermined range at each side of the initial position, then the two test positions are taken as current test positions, respectively. Act 802 is returned to and performed (e.g., the operations of acts 802 to 804 are performed on the two test positions, respectively). Otherwise, act 102 is performed. If in act 804a, it is determined to carry out a rough search, then in act 805, the next test position may be determined according to the current test position and the second test interval. For example, taking the situation where the interval is 2 mm, it may be determined in this act that the position that is the initial position +n×2 mm, and the position that is the initial position −n×2 mm are taken as the next test positions, respectively. If the two test positions are located within the predetermined range at each side of the initial position, the two test positions are taken as the current test positions, respectively. Act 802 is returned to and performed (e.g., the operations of acts 802 to 804 are performed on the two test positions, respectively). In this case, n is a variable, and when the 9 wave troughs cannot be detected for the first time, n is 1. When the 9 wave troughs cannot be detected for the second time, n is 2, and so on. The phase images are scanned and collected, starting from the zero point corresponding to the initial position. After the characteristic curve is obtained, whether a graph, in which there are 9 wave troughs, may be obtained is determined. If the graph may be obtained, then the same acts are repeated at the positions that are the current position +1 mm or −1 mm, and the graph is checked. If the graph cannot be obtained, the same acts are repeated at the positions that are the current position +2 mm or −2 mm. If the graph still cannot be found, the same acts are further repeated at the positions that are the current position +4 mm or −4 mm, +6 mm or −6 mm and so on, until a desired graph is found.

After the determination, Yes or No may be used to mark each point. For example, Yes represents a 9 wave troughs graph, and No represents a non-9 wave troughs graph. In this way, all the graphs with 9 consecutive wave troughs existing therein may be found simply and quickly.

Figure 9:
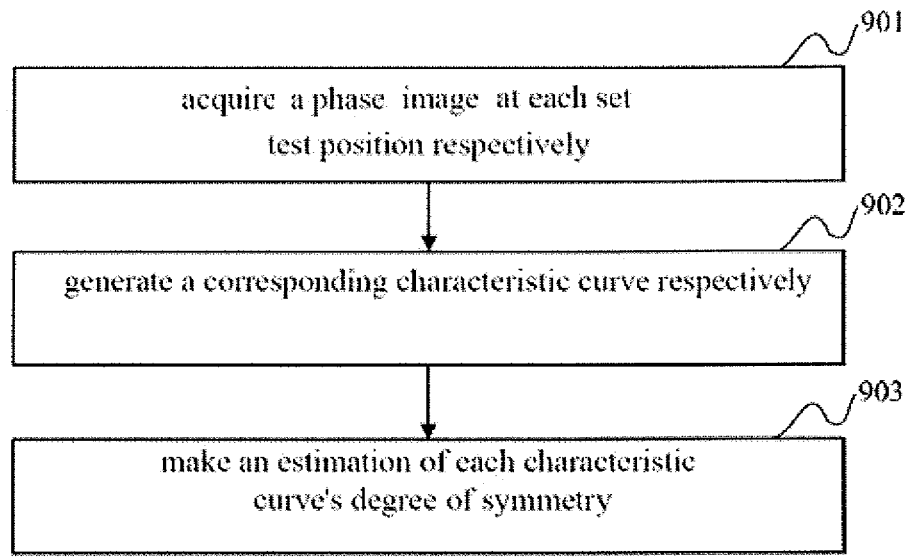
FIG. 9 is a schematic diagram of the flow of another embodiment of an implementing method of act 101 in FIG. 1.

FIG. 9 is a schematic diagram of the flow of another implementing method shown at act 101 in FIG. 1. As shown in FIG. 9, this flow includes the following acts.

In act 901, a phase image in the coronal plane direction of a phantom at each set test position of the shimming device is acquired, respectively.

In this act, the test positions are the preset test positions. For example, the test positions may be the initial position of the shimming device obtained on the basis of laser positioning and each of the positions within 10 mm at each side of the initial position at 1 mm intervals (e.g., 21 test positions in total).

In act 902, an internal contour line in the phase image at each of the test positions, respectively, is extracted. The extracted internal contour lines are respectively mapped onto a polar coordinate system to obtain the corresponding characteristic curves.

In act 903, an estimation of each degree of symmetry of the characteristic curves is made to obtain an image symmetry estimation result at the corresponding test position, respectively.

Acts 902 and 903 may further includes detecting the number of wave troughs in each characteristic curve and taking the characteristic curve with a trough number of 9 as a characteristic curve to be used for making the estimation. The symmetry estimation may be carried out only on each characteristic curve to be used for making the estimation in act 903.

Hereinabove, embodiments of methods for correcting a shimming device have been described in detail. Hereinafter, embodiments of a device for correcting a shimming device will be described in detail.

Figure 10:
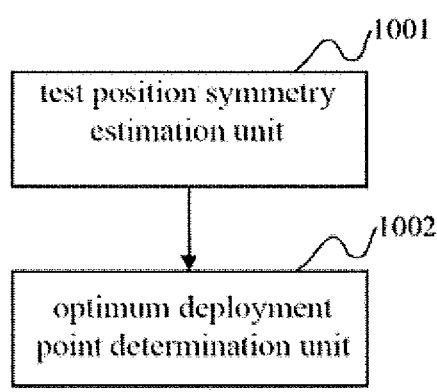
FIG. 10 is an exemplary structural diagram of one embodiment of a device for correcting a shimming device.

FIG. 10 is an exemplary structural diagram of one embodiment of a device for correcting a shimming device. As shown in FIG. 10, the device includes a test position symmetry estimation unit 1001 and an optimum deployment point determination unit 1002.

The test position symmetry estimation unit 1001 is used for acquiring a phase image in the coronal plane direction of a phantom at a test position for the test position of the shimming device, extracting an internal contour line in the phase image, mapping the internal contour line onto a rectangular coordinate system or a polar coordinate system to obtain a corresponding characteristic curve, and making an estimation of the degree of symmetry of the characteristic curve to obtain an image symmetry estimation result at the test position.

An optimum deployment point determination unit 1002 is used for selecting the test position with the best image symmetry estimation result as the optimum deployment point of the shimming device according to the image symmetry estimation result at each test position obtained by the test position symmetry estimation unit 1001.

The device for correcting the shimming device may further include an adjustment unit. The adjustment unit is used for adjusting the shimming device to the above optimum deployment point. In one embodiment, the adjustment unit may obtain a position compensation value for an initial value of the shimming device obtained by laser positioning according to the optimum deployment point of the shimming device obtained by the optimum deployment point determination unit 1002. The adjustment unit may store the position compensation value in the system. When measuring or imaging by using a magnetic field, the adjustment unit adjusts the shimming device from the initial position obtained by laser positioning to the optimum deployment point according to the position compensation value.

The device shown in FIG. 10 may be used for implementing the method shown in FIG. 1. Accordingly, the particular operation process of the test position symmetry estimation unit 1001 may be in accordance with the operation process in act 101 shown in FIG. 1. The operation process of the optimum deployment point determination unit 1002 may be in accordance with the operation process in act 102 shown in FIG. 1.

Figure 11:
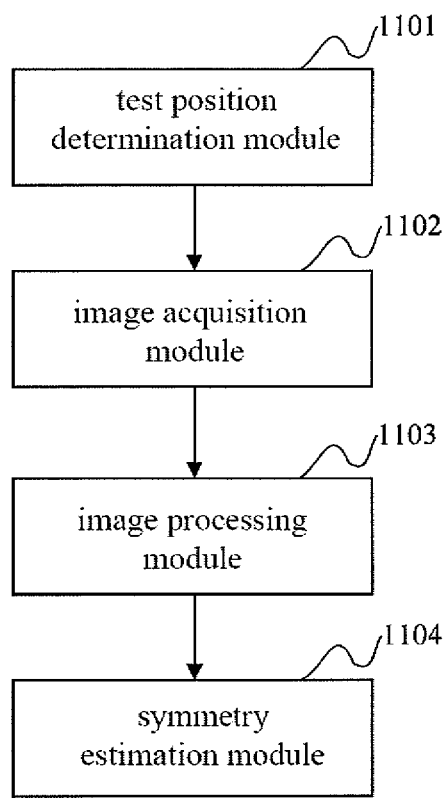
FIG. 11 is a schematic diagram of the internal structure of one embodiment of a test position symmetry estimation unit in the device shown in FIG. 10.

Corresponding to the method of the present embodiments, during practical implementation of the test position symmetry estimation unit 1001, various implementations may also be used. FIG. 11 shows a schematic diagram of the internal structure of the test position symmetry estimation unit 1001. As shown in FIG. 11, the test position symmetry estimation unit 1001 includes a test position determination module 1101, an image acquisition module 1102, an image processing module 1103, and a symmetry estimation module 1104.

Among these modules, the test position determination module 1101 is used for determining a current test position from each of the test positions of the shimming device. For example, the test position determination module 1101 may take the initial position of the shimming device obtained on the basis of laser positioning as the current test position of the shimming device when testing initially. When it is determined that there is a next test position within the predetermined range at each side of the initial position (e.g., within the test range), the next test position is taken as the current test position. Alternatively, the test position determination module 1101 may also take each preset test position, respectively, as the current test position in succession. The implementation that is used may be determined according to practical needs.

The image acquisition module 1102 is used for acquiring a phase image in the coronal plane direction of a phantom at the current test position.

The image processing module 1103 is used for extracting an internal contour line in the phase image and mapping the internal contour line onto a polar coordinate system to obtain a corresponding characteristic curve.

The symmetry estimation module 1104 is used for making an estimation of the degree of symmetry of the characteristic curve to obtain an image symmetry estimation result at the corresponding test position.

Figure 12:
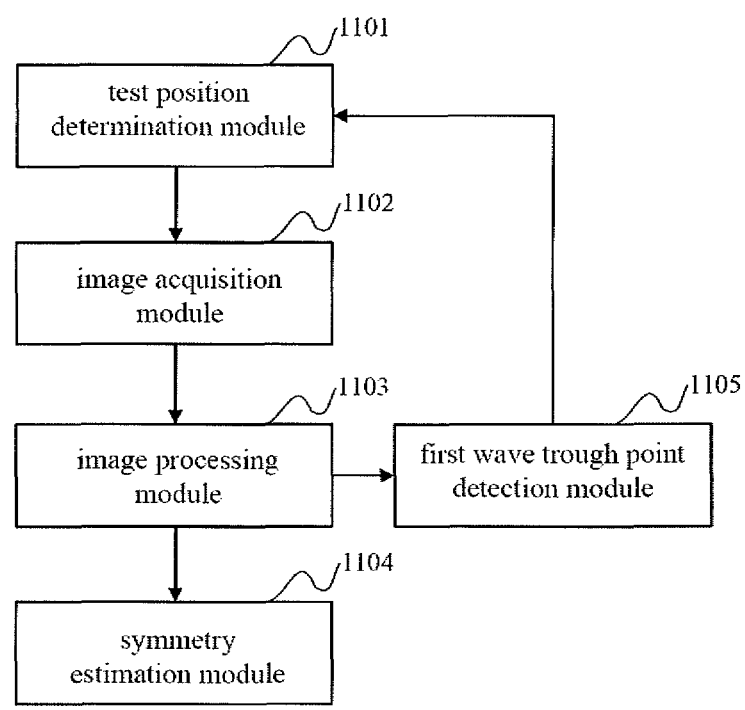
FIG. 12 is another schematic diagram of the internal structure of one embodiment of the test position symmetry estimation unit in the device shown in FIG. 10.

Corresponding to the method in the present embodiments, the test position symmetry estimation unit 1001 may be as shown in FIG. 12. The test position symmetry estimation unit 1001 may further include a first wave trough point detection module 1105 for detecting the number of wave troughs in the characteristic curve. If the number of wave troughs in the characteristic curve is 9, then a fine search is carried out, and the test interval is set as a first test interval. Otherwise, a rough search is carried out, and the test interval is set as a second test interval. The second test interval is bigger than the first test interval. Accordingly, the test position determination module 1101 determines a next test position according to the current test position and the first test interval or determines a next test position according to the current test position and the second test interval. If the next test position is located within the test range (e.g., within the predetermined range at each side of the initial position), the next test position is taken as the current test position.

Figure 13:
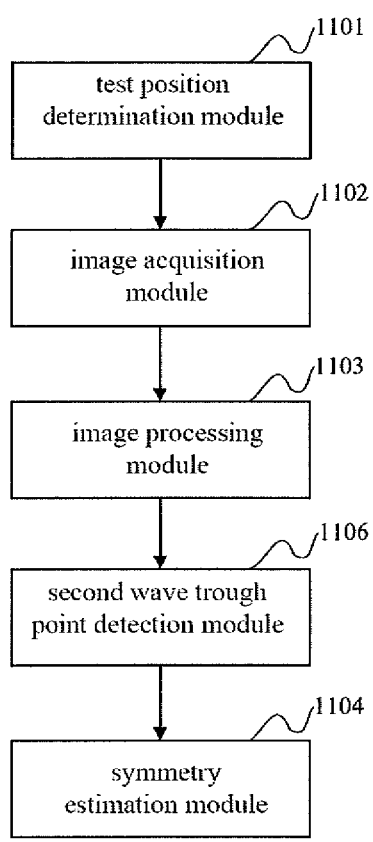
FIG. 13 is yet another schematic diagram of the internal structure of one embodiment of the test position symmetry estimation unit in the device shown in FIG. 10.

Alternatively, the test position symmetry estimation unit 1001 may be as shown in FIG. 13. The test position symmetry estimation unit 1001 may further include a second wave trough point detection module 1106 for detecting the number of wave troughs in the characteristic curve and taking a characteristic curve having a trough number of 9 as a characteristic curve to be used for making the estimation. Accordingly, the symmetry estimation module 1104 is used for making an estimation of the degree of symmetry of the characteristic curve to be used for making the estimation to obtain an image symmetry estimation result at the corresponding test position.

Figure 14:
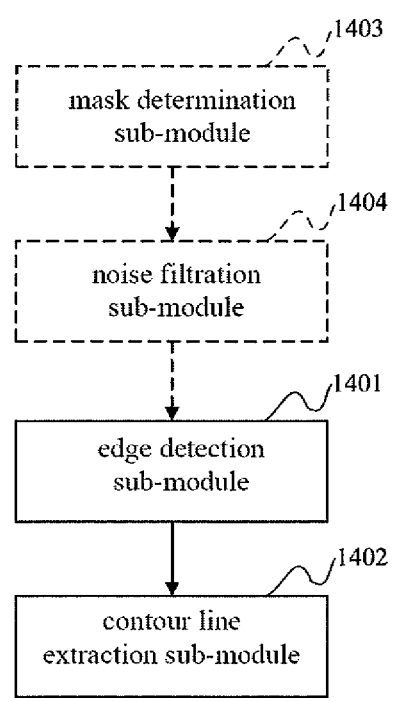
FIG. 14 is a schematic diagram of the internal structure of one embodiment of an image processing module in a test position symmetry estimation unit.

Corresponding to the method of the present embodiments, the internal structure of the image processing module 1103 may be as shown in FIG. 14. The image processing module 1103 may include an edge detection sub-module 1401 and a contour line extraction sub-module 1402.

Among these modules, the edge detection sub-module 1401 is used for detecting edges of the phase image to obtain all edge lines of the phase image.

The contour line extraction sub-module 1402 is used for extracting an internal contour line from all the edge lines.

During practical implementation, the image acquisition module 1102 may further acquire an amplitude image in the coronal plane direction of the phantom at the test position while acquiring the phase image in the coronal plane direction of the phantom at the current test position. The image processing module 1103 may further include a mask determination sub-module 1403 and a noise filtration sub-module 1404 (referring to the dotted line portion in FIG. 14).

Among these modules, the mask determination sub-module 1403 is used for determining an image mask by using a grayscale histogram of the amplitude image.

The noise filtration sub-module 1404 is used for filtering the noise of the phase image in the coronal plane direction of the phantom at the test position by using the image mask to obtain a phase image after noise filtration.

The edge detection sub-module 1401 is used for detecting edges of the phase image after noise filtration to obtain all edge lines of the phase image.

Figure 15:
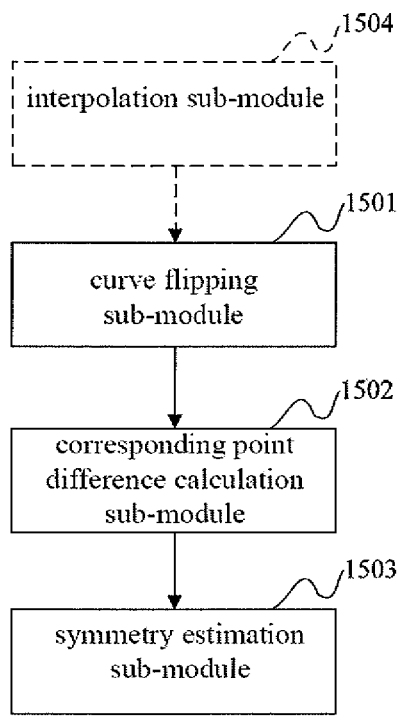
FIG. 15 is a schematic diagram of the internal structure of one embodiment of a symmetry estimation module in a test position symmetry estimation unit.

Corresponding to the method in the present embodiments, the symmetry estimation module 1104 may estimate the degree of symmetry of the characteristic curve by using various symmetry estimation methods. For example, a left-right similarity estimation method or integration estimation method may be used. FIG. 15 shows a schematic diagram of the internal structure of the symmetry estimation module 1104. As shown by the solid line portion in FIG. 15, the symmetry estimation module 1104 includes a curve flipping sub-module 1501, a corresponding point difference calculation sub-module 1502, and a symmetry estimation sub-module 1503.

Among these modules, the curve flipping sub-module 1501 is used for performing a left-right flip of the characteristic curve to obtain a flipped characteristic curve.

The corresponding point difference calculation sub-module 1502 is used for calculating position differences between a plurality of set corresponding points on the characteristic curve before flipping and after flipping to obtain the difference value of each corresponding point position.

The symmetry estimation sub-module 1503 is used for obtaining an estimation of the degree of symmetry of the characteristic curve according to the difference value of each corresponding point position.

During practical implementation, the symmetry estimation sub-module 1503 may further be as shown by the dotted line portion in FIG. 15. The symmetry estimation sub-module 1503 may include an interpolation sub-module 1504 for carrying out interpolation operation on the characteristic curve to obtain an interpolated characteristic curve. Accordingly, the curve flipping sub-module 1501 is used for performing a left-right flip of the interpolated characteristic curve to obtain a flipped characteristic curve.

Figure 16:
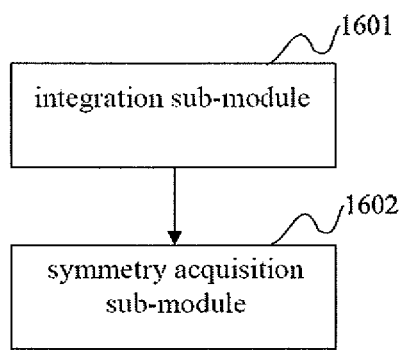
FIG. 16 is another schematic diagram of the internal structure of one embodiment of the symmetry estimation module in a test position symmetry estimation unit.

FIG. 16 shows another schematic diagram of the internal structure of the symmetry estimation module. As shown in FIG. 16, the symmetry estimation module 1104 includes an integration sub-module 1601 and a symmetry acquisition sub-module 1602.

Among these modules, the integration sub-module 1601 is used for integrating the curve within a set range located at each side of the center point of the characteristic curve to obtain integration results.

The symmetry acquisition sub-module 1602 is used for obtaining an estimation of the degree of symmetry of the characteristic curve according to the integration results.

What are described above are merely embodiments and are not to limit the present invention. Any modifications, equivalents and improvements within the spirit and principle of the present invention should be covered by the scope of protection of the present invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for correcting a shimming device, the method comprising:
   acquiring a phase image in a coronal plane direction of a phantom for each test position of the shimming device;
   extracting an internal contour line in the phase image;
   mapping the internal contour line onto a rectangular coordinate system or a polar coordinate system to obtain a corresponding characteristic curve;
   estimating a degree of symmetry of the characteristic curve, such that an image symmetry estimation for the test position is obtained; and
   selecting the test position with an optimized image symmetry estimation as an optimum deployment point of the shimming device.

2. The method as claimed in claim 1, further comprising:
   using an initial position of the shimming device as a current test position, the initial position being located within a test range, wherein acquiring the phase image comprises acquiring the phase image in the coronal plane direction of the phantom at the current test position;
   determining whether there is a next test position within the test range;
   using the next test position as the current test position when the next test position is within the test range; and
   selecting the test position when the next test position is not within the test range.

3. The method as claimed in claim 2, further comprising:
   detecting a number of wave troughs in the characteristic curve;
   setting a test interval as a first test interval when the number of wave troughs is nine;
   setting the test interval as a second test interval when the number of wave troughs does not equal nine, wherein the second test interval is bigger than the first test interval; and
   determining the next test position according to the current test position and the first test interval or according to the current test position and the second test interval.

4. The method as claimed in claim 1, further comprising:
   extracting the internal contour line from the phase image at each test position, and mapping the internal contour line to obtain the corresponding characteristic curve at each test position; and
   estimating the degree of symmetry of each characteristic curve, such that the image symmetry estimation is obtained at each of the corresponding test positions.

5. The method as claimed in claim 4, further comprising:
   detecting a number of wave troughs in each characteristic curve; and
   using the characteristic curve having a wave trough number of nine as the characteristic curve to be used for the estimating.

6. The method according to claim 1, wherein the extracting comprises:
   detecting edges of the phase image to obtain all edge lines of the phase image; and
   extracting the internal contour line from all the edge lines.

7. The method as claimed in claim 6, wherein before the detecting of the edges of the phase image, the method further comprises:
   acquiring an amplitude image in the coronal plane direction of the phantom at the test position;
   determining an image mask using a grayscale histogram of the amplitude image; and
   filtering noise of the phase image using the image mask.

8. The method according to claim 1, wherein the estimating comprises:
   performing a left-right flip of the characteristic curve;
   calculating position differences between a plurality of corresponding points on the characteristic curve before flipping and after flipping to obtain a difference value for each corresponding point position; and
   estimating the degree of symmetry of the characteristic curve according to the difference value for each corresponding point position; or
   performing a curve integration within a set range located on each side of a center point of the characteristic curve, and estimating the degree of symmetry of the characteristic curve according to the performed curve integration.

9. The method as claimed in claim 1, further comprising:
   adjusting the shimming device into the optimum deployment point;
   obtaining a position compensation value for an initial position of the shimming device according to the optimum deployment point and storing the position compensation value; and
   adjusting the shimming device into the optimum deployment point according to the position compensation value.

10. A device for correcting a shimming device, the device comprising:
    a test position symmetry estimation unit configured for acquiring a phase image in a coronal plane direction of a phantom for each test position of the shimming device, the test position symmetry estimation unit configured for extracting an internal contour line in the phase image, mapping the internal contour line onto a rectangular coordinate system or a polar coordinate system to obtain a corresponding characteristic curve, and estimating a degree of symmetry of the characteristic curve, such that an image symmetry estimation is obtained at the test position; and an optimum deployment point determination unit configured for selecting the test position with the best image symmetry estimation result as the optimum deployment point of the shimming device.

11. The device as claimed in claim 10, wherein the test position symmetry estimation unit comprises:
a test position determination module configured for determining a current test position from each test position of the shimming device;
an image acquisition module configured for acquiring the phase image in the coronal plane direction of the phantom at a current test position;
an image processing module configured for extracting the internal contour line in the phase image, and mapping the internal contour line to obtain the corresponding characteristic curve; and
a symmetry estimation module configured for estimating the degree of symmetry of the characteristic curve, such that the image symmetry estimation is obtained at the corresponding test position.

12. The device as claimed in claim 11, wherein the test position symmetry estimation unit further comprises a first wave trough point detection module configured for:
detecting a number of wave troughs in the characteristic curve;
setting a test interval as a first test interval when the number of wave troughs is nine; and
setting the test interval as a second test interval when the number of wave troughs is not nine, the second test interval being bigger than said first test interval, wherein the test position determination unit is configured to determine a next test position according to the current test position and the first test interval or the second test interval, and when the next test position is located within a predetermined test range, use the next test position as the current test position; or
wherein the test position symmetry estimation unit further comprises a second wave trough point detection module configured for detecting the number of wave troughs in the characteristic curve, and using the characteristic curve having a trough number of nine as the characteristic curve to be used for the estimating.

13. The device according to claim 11, wherein the image processing module comprises:
an edge detection sub-module configured for detecting edges of the phase image to obtain all edge lines of the phase image; and
a contour line extraction sub-module configured for extracting an internal contour line from all the edge lines.

14. The device as claimed in claim 13, wherein the image acquisition module is further configured for acquiring an amplitude image in the coronal plane direction of the phantom at the current test position; and
wherein the image processing module further comprises:
a mask determination sub-module configured for determining an image mask using a grayscale histogram of the amplitude image; and
a noise filtration sub-module configured for filtering noise in the phase image at the test position using the image mask and providing the filtered phase image to the edge detection sub-module.

15. The device according to claim 11, wherein the symmetry estimation module comprises:
a curve flipping sub-module configured for performing a left-right flip of the characteristic curve to obtain a flipped characteristic curve;
a corresponding point difference calculation sub-module configured for calculating position differences between a plurality of corresponding points on the characteristic curve before flipping and after flipping to obtain a difference value for each corresponding point position; and
a symmetry estimation sub-module configured for obtaining an estimation for the degree of symmetry of the characteristic curve according to the difference value for each corresponding point position, or
wherein the symmetry estimation module comprises:
an integration sub-module configured for performing a curve integration within a set range located at each side of a center point of the characteristic curve to obtain an integration result; and
a symmetry acquisition sub-module configured for obtaining an estimation of the degree of symmetry of the characteristic curve according to the integration results.

16. The device according to claim 12, wherein the image processing module comprises:
an edge detection sub-module configured for detecting edges of the phase image to obtain all edge lines of the phase image; and
a contour line extraction sub-module configured for extracting an internal contour line from all the edge lines.

17. The device according to claim 12, wherein the symmetry estimation module comprises:
a curve flipping sub-module configured for performing a left-right flip of the characteristic curve to obtain a flipped characteristic curve;
a corresponding point difference calculation sub-module configured for calculating position differences between a plurality of corresponding points on the characteristic curve before flipping and after flipping to obtain a difference value for each corresponding point position; and
a symmetry estimation sub-module configured for obtaining an estimation for the degree of symmetry of the characteristic curve according to the difference value for each corresponding point position, or
wherein the symmetry estimation module comprises:
an integration sub-module configured for performing a curve integration within a set range located at each side of a center point of the characteristic curve to obtain an integration result; and
a symmetry acquisition sub-module configured for obtaining an estimation of the degree of symmetry of the characteristic curve according to the integration results.

18. The device according to claim 13, wherein the symmetry estimation module comprises:
a curve flipping sub-module configured for performing a left-right flip of the characteristic curve to obtain a flipped characteristic curve;
a corresponding point difference calculation sub-module configured for calculating position differences between a plurality of corresponding points on the characteristic curve before flipping and after flipping to obtain a difference value for each corresponding point position; and
a symmetry estimation sub-module configured for obtaining an estimation for the degree of symmetry of the characteristic curve according to the difference value for each corresponding point position, or wherein the symmetry estimation module comprises:
an integration sub-module configured for performing a curve integration within a set range located at each side of a center point of the characteristic curve to obtain an integration result; and
a symmetry acquisition sub-module configured for obtaining an estimation of the degree of symmetry of the characteristic curve according to the integration results.

19. The device according to claim 14, wherein the symmetry estimation module comprises:
a curve flipping sub-module configured for performing a left-right flip of the characteristic curve to obtain a flipped characteristic curve;
a corresponding point difference calculation sub-module configured for calculating position differences between a plurality of corresponding points on the characteristic curve before flipping and after flipping to obtain a difference value for each corresponding point position; and
a symmetry estimation sub-module configured for obtaining an estimation for the degree of symmetry of the characteristic curve according to the difference value for each corresponding point position, or wherein the symmetry estimation module comprises:
an integration sub-module configured for performing a curve integration within a set range located at each side of a center point of the characteristic curve to obtain an integration result; and
a symmetry acquisition sub-module configured for obtaining an estimation of the degree of symmetry of the characteristic curve according to the integration results.

* * * * *